United States Patent [19]

Clark, Jr. et al.

[11] Patent Number: 4,670,685

[45] Date of Patent: Jun. 2, 1987

[54] LIQUID METAL ION SOURCE AND ALLOY FOR ION EMISSION OF MULTIPLE IONIC SPECIES

[75] Inventors: William M. Clark, Jr., Thousand Oaks; Mark W. Utlaut, Saugus; Joseph A. Wysocki, Oxnard, all of Calif.; Edmund K. Storms, Los Alamos, N. Mex.; Eugene G. Szklarz, Los Alamos, N. Mex.; Robert G. Behrens, Los Alamos, N. Mex.; Lynwood W. Swanson; Anthony E. Bell, both of McMinnville, Oreg.

[73] Assignee: Hughes Aircraft Company, Los Angeles, Calif.

[21] Appl. No.: 851,755

[22] Filed: Apr. 14, 1986

[51] Int. Cl.$^4$ .......................... H01J 1/05; H01J 27/26
[52] U.S. Cl. .................................... 313/230; 313/163; 250/425
[58] Field of Search ...................... 313/361.1, 230, 232, 313/163; 250/423 R, 425

[56] References Cited

U.S. PATENT DOCUMENTS 4,367,429  1/1983  Wang et al. .................... 313/230 X Primary Examiner—Palmer C. DeMeo
Assistant Examiner—Sandra L. O'Shea
Attorney, Agent, or Firm—Wanda K. Denson-Low; A. W. Karambelas

[57] ABSTRACT

A liquid metal ion source and alloy for the simultaneous ion evaporation of arsenic and boron, arsenic and phosphorus, or arsenic, boron and phosphorus. The ionic species to be evaporated are contained in palladium-arsenic-boron and palladium-arsenic-boron-phosphorus alloys. The ion source, including an emitter means such as a needle emitter and a source means such as U-shaped heater element, is preferably constructed of rhenium and tungsten, both of which are readily fabricated. The ion sources emit continuous beams of ions having sufficiently high currents of the desired species to be useful in ion implantation of semiconductor wafers for preparing integrated circuit devices. The sources are stable in operation, experience little corrosion during operation, and have long operating lifetimes.

11 Claims, 5 Drawing Figures

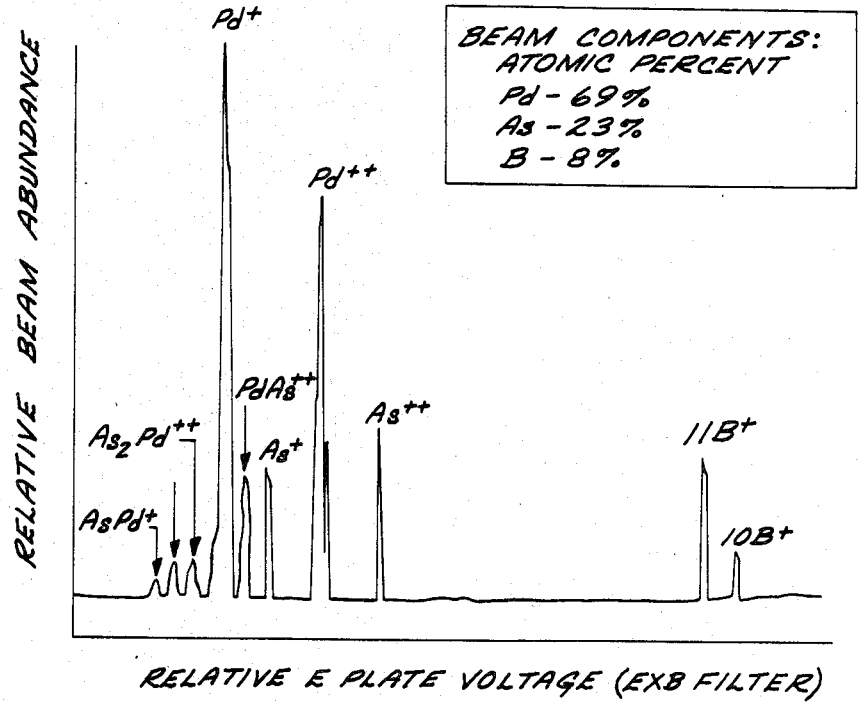
FIG.4
FIG.5
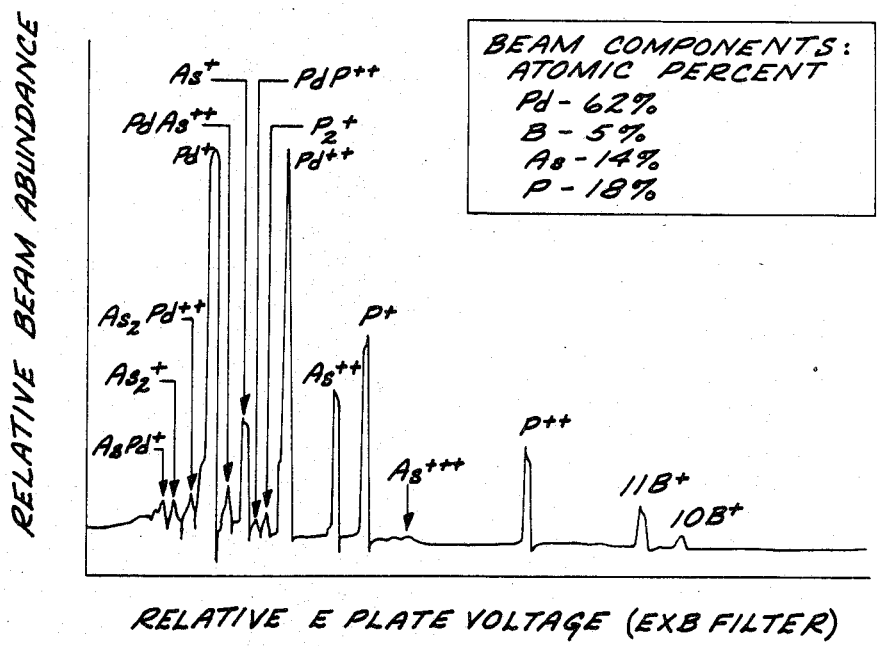

LIQUID METAL ION SOURCE AND ALLOY FOR ION EMISSION OF MULTIPLE IONIC SPECIES

The U.S. government has rights in this invention pursuant to Contract No. 83F842300.

BACKGROUND OF THE INVENTION

This invention relates to liquid metal ion sources, and, more particularly, to alloys used to evaporate multiple ionic species from such sources.

Liquid metal ion sources provide high current density beams of metallic ions from a source having a small virtual source size. Such high current and small source size are required when the ion beam is to be focused with a high resolution of, for example, less than 1 micrometer spot size and utilized in applications such as fabrication of semiconductor microcircuits by ion implantation. The high current density and small virtual source size are achieved by emitting the ions from a substrate having a sharp point, such as the point of a needle. In one such approach, a needle is covered with a layer of liquid ion source metal, and a cusp in the liquid metal at the point of the needle is created by the application of an electrostatic extraction field. The ions are emitted from this tiny cusp. As the ions are emitted and the amount of liquid alloy decreases, more liquid metal flows from a reservoir down the needle to the cusp to replenish that emitted.

In this type of ion source, a species to be implanted typically resides in a liquid alloy while in the reservoir and on the needle. This alloy must be heated to at least its melting point and remain in the molten state for long periods of time during ion implantation runs. When an alloy is held molten for this long period of time, species which have high vapor pressures can be lost from the alloy in significant amounts, so that the alloy composition changes over time. This change in the composition of the ion source alloy over time can be highly significant and deleterious in the fabrication of semiconductor microcircuits, due to the change in the current density of the ionic species to be implanted in the semiconductor chip. Additionally, the long period of contact between the molten alloy and the emission elements of the liquid metal ion source, including the reservoir and the needle substrate, can cause corrosion and failure of these elements. The lifetime of a liquid metal ion source is often limited by the attack and corrosion of the emission elements by the molten alloy, and such corrosion can undesirably change the emission characteristics of an operating ion source over time.

The most straightforward approach to providing an evaporation source for an ionic species is to provide the species in its elemental, unalloyed form. However, many important dopant and metalloid ions for implantation into active areas of microcircuits, such as arsenic, antimony and phosphorus, have high vapor pressures at their melting points, resulting in atomic evaporation and loss of the element. The melting points are also rather high, so that corrosion of the evaporation elements occurs when the pure liquid metal and the evaporation element are in contact for long periods of time.

An alternative approach is to form an alloy of the desired ion evaporation species with other metal or metalloid constituents chosen so that the melting point of the alloy is lowered below that of the pure species, and further so that the corrosion of the emission elements by the liquid alloy is reduced, as compared with the unalloyed pure evaporation species. Conventionally, the alloy has been chosen to be of eutectic or near-eutectic composition. A eutectic reaction depresses the liquidus temperature of any of the reactants, to an intermediate melting point, which is the composition at which that liquid can exist to the lowest temperature without formation of any solid. The use of a eutectic or near-eutectic composition in a liquid metal ion source allows the source to be operated with the liquid alloy at a minimum temperature, thereby reducing the corrosion rate of the alloy on the evaporation source elements. Both the desired species and the alloying elements are ion evaporated from the source, but the desired species may be selected for implantation using a velocity filter which acts as a mass separator to pass only the selected species.

A further important consideration in the selection of liquid metal ion source alloys is the wetting of the source elements by the alloy. The alloy must wet the evaporation elements sufficiently so that it forms a liquid layer on the evaporation elements, and so that additional metal can flow from the reservoir to the needle tip during continuous evaporation runs. The attainment of sufficiently good wettability and minimization of corrosion are difficult to achieve simultaneously in many instances.

In the fabrication of semiconductor microcircuit devices using ion implantation techniques, it would often be desirable to be able to ion evaporate useful currents of several different ionic species from a single source. Such multiple evaporation capability would allow the sequential or simultaneous implantation of different ionic species into an area of a device, with extreme accuracy and control of lateral and vertical implantation profiles, since neither the target nor the ion source would be changed, replaced or physically adjusted during the process. Self-aligned implantations and laterally profiled dopants could then be routinely fabricated, thus allowing the fabrication of innovative device structures.

For the fabrication of silicon-based microcircuits, it would be particularly useful to have an ion source capable of simultaneously evaporating arsenic ions for n-type shallow, heavy implants, and boron for p-type implants. It would also be desirable to have a source capable of imlanting arsenic and boron ions, and in addition implanting phosphorus ions for n-type deep implants. There have been proposed no ion sources capable of simultaneously ion evaporating arsenic, boron and phosphorus, and previously reported sources evaporating both boron and arsenic had unacceptably low yields of one species and/or short lifetimes. Sources are known to ion evaporate individual ions, such as arsenic, but no sources have been proposed for simultaneously evaporating the combinations of ions indicated above. Experimental and theoretical studies have indicated that simultaneous, continuous evaporation of multiple ionic species of interst would be difficult or impossible, since the ions inherently exhibit different evaporation threshold values. Thus, for example, the evaporation threshold voltage for boron ions is approximately twice that of arsenic ions, and prior work such as disclosed in U.S. Pat. No. 4,367,429 suggests that simutlaneous evaporation of such differing species would not occur. Finally, in an attempt to provide an ion source for simultaneously evaporating multiple species, the usual considerations of wetting and inhibition of corrosion of the emission elements must be satisfied in a more complex alloy.

Consequently, there has been provided no practical ion source for the simultaneous evaporation of multiple ionic species of interest, including arsenic-boron, arsenic-phosphorus, and arsenic-boron-phosphorus. The sources and alloys used therein would desirably allow the operation of the source under stable operating conditions for long periods of time without adverse corrosive effects. The present invention provides such an ion source, and further provides related advantages.

SUMMARY OF THE INVENTION

The present invention provides a liquid metal ion source and alloy for the simultaneous evaporation of multiple ionic species of use in the ion implantation of silicon-based devices. In particular, there is provided a source for the simultaneous ion evaporation of arsenic and boron, arsenic and phosphorus, or arsenic, boron and phosphorus. The alloys wet the materials of construction of the emission elements of the ion source, allowing continuous flow operation. The ion evaporation process is sufficiently stable that control of evaporation may be achieved in standard apparatus. The corrosive effects are sufficiently small that the ion source may be operated for long periods of time in commercial ion implantation operations.

In accordance with the invention, a liquid metal ion source comprises emission means for emitting positively charged ionic species; and source means for supplying to the emission means the ionic species to be emitted, the species being provided in a substantially nickel-free alloy consisting essentially of palladium, arsenic, and at least one element to be co-emitted, the element being selected from the group consisting of boron, phosphorus, and combinations thereof. The alloy is preferably at least 50 atomic percent palladium, and most preferably about 70 atomic percent palladium.

In another aspect of the invention, one such alloy for the simultaneous evaporation of arsenic and boron includes palladium, arsenic and boron. A preferred alloy of this type contains about 70 atomic percent palladium, 16 atomic percent arsenic, and 14 atomic percent boron. In another aspect, an alloy useful for the simultaneous evaporation of arsenic, boron and phosphorus includes palladium, arsenic, boron and phosphorus. Most preferably, this alloy contains about 73 atomic percent palladium, 8 atomic percent arsenic, 7 atomic percent boron, and 12 atomic percent phosphorus.

The alloys providing the species for ion evaporation are used in conjunction with ion sources having a conventional construction, wherein the emission means is a needle emitter and the source means is a U-shaped heater element in which a reservoir of the molten metal is formed by resistance heating. The source alloy containing the species for ionic evaporation is prepared by any convenient method and then loaded into the ion source in a finely divided form. The source is heated by the passage of electrical current through the U-shaped heater element, and ions are drawn off the tip of the needle by an extraction electrode, thence passing into an ion optical column or other appropriate apparatus for conditioning the ion beam and controlling the implantation. Although the ion source simultaneously evaporates multiple species, a single species may be selected for implantation by passing the ion beam through a mass separator so that only the selected species is allowed to impact the target.

It will now be appreciated that the ion source of the present invention represents an important advance in the development of commercial ion implantation technology. A single ion source may be used for the evaporation of multiple ionic species of interest, so that the source does not have to be changed between processing steps involving implantation of different ions. The source is stable with a reasonably long operating lifetime. Other features and advantages of the present invention will become apparent from the following more detailed description, taken in conjunction with the accompanying drawings, which illustrate, by way of example, the principles of the invention.

BRIEF DESCRIPTION OF THE DRAWINGS

FIG. 4 is a mass spectrum of a palladium-arsenic-boron liquid alloy which has been ion emitted from a tungsten needle; and FIG. 5 is a mass spectrum of a palladium-arsenic-boron-phosphorus alloy which has been ion emitted from an tungsten needle.

DETAILED DESCRIPTION OF THE PREFERRED EMBODIMENT

Figure 1:
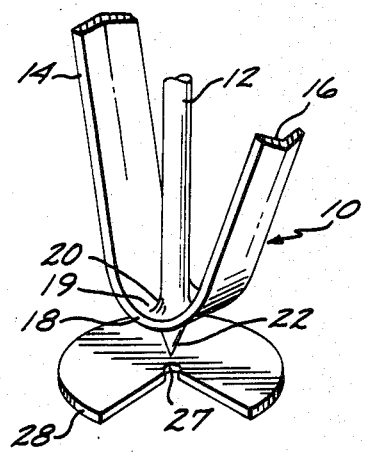
FIG. 1 is a perspective view of one type of liquid metal ion source structure.

The present invention relates to a liquid metal ion source, indicated generally by the numeral 10 in FIG. 1. The ion source 10 includes an ion evaporation substrate needle 12 typically having a tip radius of less than about 20 micrometers and an apex half angle of less than about 49.5°, which extends through a hole (not visible) at the lower end of a generally U-shaped heater element 14. The heater element 14 is in the form of a U-shaped ribbon which may incorporate an embossed crease 16 in each leg thereof to increase the columnar strength of the heater element 14. If used, the crease 16 approaches an apex bend 18 at the lower end of the heater element 14, but does not enter the region of the apex bend 18 itself. Ion source alloy (in powdered, chip, or otherwise finely divided form) is placed in the apex bend 18 of the heater element 14 and an electrical current, produced by a voltage $V_H$, is passed through this heater element 14, so that the alloy melts and naturally forms a reservoir 19 of liquid metal in the apex bend 18 of the heater element 14. The reservoir 19 remains anchored in the apex bend 18 under the influence of gravity because surface tension tends to minimize the meniscus 20 of liquid metal.

The needle 12 passes through a non-circular hole (not visible) in the heater element 14, so designed as to allow liquid metal to flow to a needle tip 22 yet still retain the needle 12. In proper operation of the ion source 10, heating of the heater element 14 melts the metal in the reservoir 19 to wet the inner surface of the apex bend 18 of the heater element 14. The molten metal conducts heat to the needle 12 so that the molten metal is wet to the needle 12. Ultimately, the molten metal flows along the needle 12 to the needle tip 22, for subsequent ion evaporation.

Figure 2:
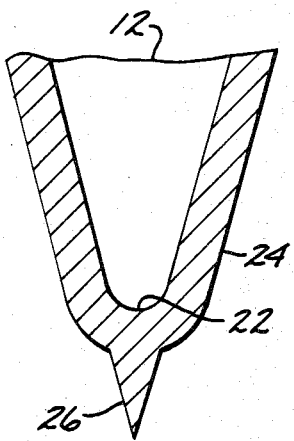
FIG. 2 is an enlarged cross-sectional view of a detail of FIG. 1, illustrating the point of the emitter needle.

Referring to FIGS. 1 and 2, the liquid source metal flows from the reservoir 19 located in the apex bend 18 toward the tip 22 of the needle 12, forming a liquid layer 24 along the tip 22 of the needle 12. At the very tip of the needle 12, where the liquid layers 24 from the sides of the needle 12 meet, the action of an applied external electrostatic field, produced by an extraction electrode 28, draws the liquid layers 24 downwardly to form a cusp 26. The ions emitted by the ion source 10 are preferably emitted only from the cusp 26, located adjacent to the extreme end of the needle tip 22, so that ions appear to emanate from a point source of extremely small dimensions. Positively charged ions are drawn from the cusp 26 by an electrostatic field set up between the ion source 10 and the extraction electrode 28 through the application of a voltage $V_E$. Ions leave the cusp 26 and pass through a hole 27 in the extraction electrode 28. With this configuration, the current density of emitted ions at the cusp 26 can be very large, typically on the order to $10^4$ amps per square centimeter per steradian.

The liquid layer 24 must flow from the reservoir 19 located in the apex bend 18 down the surface of the needle 12 to the cusp 26, for emission to be initiated and sustained. However, it is often difficult to initiate and sustain a flow of metal from the reservoir 19, and it is also sometimes difficult to initiate and sustain a wetted flow of source metal in the layer 24 along the needle 12 because of difficulty in wetting the alloy to the substrate. On the other hand, if wetting is too extensive, a chemical interaction between the molten metal and the solid substrate can result in corrosion of the substrate, so that portions of the substrate are dissolved. As a result, pits, cracks, or fissures can form in the needle tip 22, the needle 12 may fail entirely, or multiple cusps may be formed due to the corrosion geometry, so that the source 10 cannot be properly focused.

Figure 3:
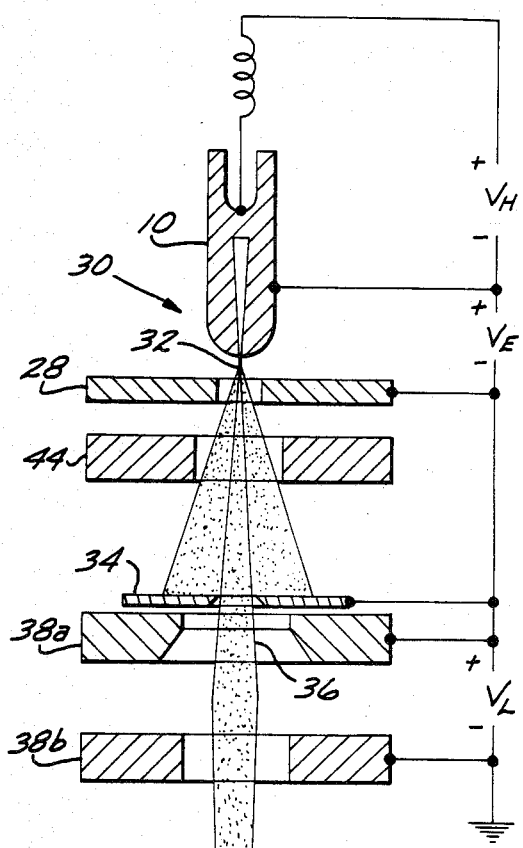
FIG. 3 is a schematic sectional side view of a scanning ion probe employing a liquid metal ion source.

FIG. 3 illustrates one important use of liquid metal ion sources of the type illustrated in FIGS. 1 and 2. The ion source 10 is mounted in a scanning ion probe 30. The extraction electrode 28, which is negatively biased with respect to the needle 12 by the voltage $V_E$, draws ion out of the cusp 26, to form an ion beam 32. A small portion of this beam 32, typically about 1 milliradian, is allowed to pass through an aperture 34 into the optics section of the scanning ion probe 30. A transmitted beam 36 emerging from the aperture 34 is passed through accelerating electrodes 38 which increase the energy of the beam 36, as the second accelerating electrode 38b is negatively biased with respect to the first electrode 38a by a voltage $V_L$. The converging beam 36 then passes through electrostatic deflection electrodes 40 wherein the beam is deflected from side-to-side to move in a scanning fashion across the surface of a target 42. The transmitted beam 36 can then be used to write various patterns upon the surface of the target 42 in the form of ion implanted zones of controllable shape and type. The beam may also be used to ion machine very narrow grooves or very small holes. Through the incorporation of a secondary electron detector (not shown), the beam may be used to image the target in a fashion similar to that of a scanning electron microscope. Finally, through the incorporation of a secondary ion mass spectrometer (not shown), the micro-composition of a very small region located on the target 42 may be analyzed in both a qualitative and quantitative manner.

Preferably, there is also provided an $E \times B$ mass separator 44 to deflect ions of differing masses by differing amounts. The mass separator 44 is preferably a Wein velocity filter which acts as a mass separator because of the very low energy spread of the beam obtained from a liquid metal ion source when properly operated. The mass separator 44 is preferably positioned between the extraction electrode 28 and the aperture 34, and includes means to produce magnetic and electrical fields within the mass separator 44. The fields within the mass separator 44 deflect the moving ions passing therethrough by amounts which are related to the mass, velocity and charge of the ions in the beam. By varying the strength of the magnetic and electrical fields and the positioning of the mass separator 44, it is possible to allow only a single desirable species to pass through the aperture 34 to be implanted in the target 42, while all other species are deposited on the upper side of the aperture 34. FIGS. 4 and 5 illustrate the mass spectra of beams of ions from palladium-arsenic-boron and palladium-arsenic-boron-phosphorus sources, respectively, plotting the relative target currents as a function of the relative plate voltage of the mass separator 44. It is apparent that ions of particular types and charge states may be selected by setting the plate voltage to correspond to the peak for the selected ion.

In preparing an ion source for arsenic and boron ionic species, the source means containing the species to be evaporated as ions includes an alloy consisting essentially of palladium, arsenic and boron, the alloy being substantially free of any nickel. Where the palladium content is less than about 50 atomic percent, the ion source is operable and stable in emitting both boron and arsenic, but exhibits a relatively short lifetime of 6–10 hours. Since source operating lifetimes of at least 50 hours are desirable, it is preferred that a higher palladium content be utilized. Specifically, palladium contents of about 70 atomic percent have been found highly satisfactory to produce stable, long lifetime ion sources, as will be described more fully in the examples present below.

The most preferred source alloy for the simultaneous evaporation of arsenic and boron has about 70 atomic percent palladium, 16 atomic percent arsenic, and 14 atomic percent boron. FIG. 4 illustrates the mass spectrum for a source having a rhenium heater ribbon and a tungsten emitter needle. Usable currents of both boron and arsenic, in each of several ionic forms, are obtained. The beam is approximately stoichiometric in palladium content, although the arsenic content of the beam is measured to be greater than that of the source alloy and the boron content of the beam is measured to be less than that of the source alloy. This result is not surprising, since the theory of field evaporation suggests that species having the lowest field thresholds will be preferentially ion evaporated. The field thresholds of palladium, arsenic and boron are estimated to be, respectively, 3.8 V/A (volts per angstrom), 4.55 V/A and 6.5 V/A. The theory of field ion evaporation also suggests that doubly ionized species of some atoms are preferentially emitted over singly ionized species. In view of these predictions, it is unexpected that palladium-arsenic-boron sources would produce any usable current of boron ions. For the results shown in FIG. 7, the angular current intensities are determined to be 5 micro amps per steradian for $As^{++}$ and 1.5 micro amps per steradian for $^{11}B^+$, at a total extraction current of 20 microamps.

For achieving the simultaneous ion evaporation of arsenic, boron and phosphorus, the source means containing the species to be evaporated as ions is an alloy consisting essentially of palladium, arsenic, boron and phosphorus, and is substantially nickel-free. A first presently preferred source alloy contains about 73 atomic percent palladium, 8 atomic percent arsenic, 7 atomic percent boron, and 12 atomic percent phosphorus; and a second preferred alloy contains about 64 atomic percent palladium, 11 atomic percent arsenic, 9 atomic percent boron, and 16 atomic percent phosphorus. When evaporated from an ion source including a tungsten needle and tungsten heater, the second preferred alloy produces the mass spectrum illustrated in FIG. 5. The source is stable with a relatively long lifetime. As with the source described previously for arsenic and boron ions, the source for arsenic, boron and phosphorus ions produces useable currents of all three species, with the arsenic and boron composition of the beam slightly greater than that of the liquid source alloy, and the boron content of the beam slightly less than that of the source alloy. It would be desirable that the beam composition be identical with that of the molten source alloy, but again it is unexpected that usable currents of all three species are obtained simultaneously.

It is particularly noteworthy in FIG. 5 that substantial currents of $P^{++}$ are obtained. Phosphorus is an n-dopant used to adjust the threshold for FET devices and to set a deep well for subsequent base implants in vertical npn bipolar devices. For deep implants, a high fraction of $P^{++}$ is desirable, and the ion source of the present invention provides a usable current of $P^{++}$ ions.

It is important that the source alloy be substantially free of nickel. Tests with palladium-nickel-arsenic-boron alloys have indicated that arsenic and boron can be simultaneously emitted from this alloy, but that the nickel in such a molten source alloy tends to corrode the tungsten emitter needles and ribbons very rapidly, greatly limiting the lifetime of the ion source. It has previously been thought that nickel must be included in such source alloys to insure wetting of the emission elements by the liquid source alloy, but it has been found that the palladium-arsenic-boron and palladium-arsenic-boron-phosphorus alloys of the present invention are acceptably wetted to the emission needles and ribbons, without corrosively attacking them.

The operability, wettability, and long lifetime of the source alloys of the present invention cannot be predicted from the behavior of related binary alloys. It is well known that platinum-boron and nickel-boron alloys chemically react rapidly with tungsten and rhenium, to rapidly corrode these candidate emitter and ribbon materials. Related binary alloys also do not produce acceptable wetting characteristics. An alloy of 75 atomic percent palladium and 25 atomic percent phosphorus is too fluid to be used as a source alloy, since when melted such an alloy runs to the tip of the needle emitter and then drops off. An alloy of 72 atomic percent palladium and 28 atomic percent boron has too high a viscosity for use as a source alloy, since such a binary alloy forms balls on the needle and will not flow to the needle tip, resulting in improper emission characteristics.

Ion source alloys in accordance with the invention may be prepared and supplied to the emission means in any appropriate manner. In one approach, pieces of the constituents are placed into a crucible and melted. The emission means can be loaded by dipping it into the melt. This approach is not preferred, since arsenic is easily lost from unconfined melts, and because of the expense of preparing the alloys.

In a preferred approach, previously prepared pieces of related compounds are placed into a sealed quartz ampoule, and the ampoule is then heated to melt the pieces contained therein. For example, a palladium-arsenic-boron alloy can be prepared by mixing appropriate fractions of palladium-arsenic and palladium-boron alloys that have been previously prepared. After solidification and cooling of the melt, the alloy may be readily broken into small pieces which can then be placed into the ion source, and supported in the U-shaped apex bend 18 of the heater element ribbon 14. Similarly, a palladium-arsenic-boron-phosphorus alloy is prepared by combining appropriate amounts of powdered alloys of palladium-arsenic, palladium-boron, and palladium-phosphorus.

The following examples are presented to illustrate aspects of the invention, and are not to be taken as limiting the scope of the invention in any respect.

EXAMPLE 1

An alloy containing 50 atomic percent palladium, 25 atomic percent arsenic and 25 percent boron was prepared, and ion evaporated using a tungsten needle and a tungsten heater ribbon. The ion source operated well, with sufficient stability for a mass spectrum of the ion beam to be obtained. Both boron and arsenic were observed in the beam. However, the tungsten needle and heater ribbon were corroded in 6-10 hours, which is marginally acceptable for a commercial ion source.

EXAMPLE 2

A source alloy of 70 atomic percent palladium, 16 atomic percent arsenic and 14 atomic percent boron was prepared by heating the appropriate fractions of powdered $Pd_2As$ and $PdB$ alloys in a quartz ampoule. The resulting alloy was broken into small pieces and loaded into an ion source having a tungsten needle and a tungsten heater ribbon. The source ran well, with good stability. Both boron and arsenic were observed in the mass spectrum of the beam. After about twenty hours operation, however, the boron content in the ion beam decreased to about 30 percent of its original value. Additional alloy was then loaded into the ion source, but the boron content of the beam was not increased significantly. It is believed that the decrease in the boron fraction in the beam is due to dissolution of boron into the tungsten heater ribbon (which operates at a higher temperature than the tungsten needle).

EXAMPLE 3

Example 12 was repeated, except that the tungsten heater ribbon was replaced by a rhenium heater ribbon. The resulting ion source was stable, and both boron and arsenic were observed in the mass spectrum of the beam, as illustrated in FIG. 4. The boron content remained substantially constant with time, probably due to the lower rate of attack of liquid metals on rhenium than on tungsten.

EXAMPLE 4

Fifteen of the ion sources prepared as described in Example 3 were fabricated and tested. All of the sources ran well, with a high degree of stability so that adjustments to the operating parameters of the source had to be made only infrequently. All fifteen of the sources exhibited operating lifetimes of greater than 50 hours, and tests were terminated only because the source alloy was depleted through ion evaporation. In seven instances, the ion sources were reloaded with the source alloy, and operation of the ion source was resumed. These sources ran over 150 hours, and the tests were terminated without failure of the ion sources. The emitter needle and heater ribbons of some of these sources, operated for 150 hours, have been examined in a scanning electron microscope, and there was no apparent corrosion of either the needle or ribbon. It is therefore believed that the alloy sources of this example could operate to substantially greater lifetimes without failure.

EXAMPLE 5

An alloy containing 40 atomic percent palladium, 40 atomic percent nickel, 10 atomic percent arsenic, and 10 atomic percent boron was fabricated. This alloy is not within the scope of the invention, in that it contains a substantial nickel content. An ion source was prepared using this source alloy, together with a tungsten needle and tungsten heater ribbon. Although the ion source did operate, it was unacceptable for two reasons. First, the presence of nickel resulted in rapid corrosion of the tungsten and failure of the ion source. Second, the amount of boron found in the ion beam was unacceptably low, and therefore this ion source (having less than 50 atomic percent palladium) was unacceptable for the simultaneous ion evaporation of arsenic and boron.

EXAMPLE 6

A source alloy of 64 atomic percent palladium, 11 atomic percent arsenic, 9 atomic percent boron, and 16 atomic percent phosphorus was prepared by heating the appropriate ratios of previously obtained powdered alloys of $Pd_2As$, $Pd_{.72}B_{.28}$ and $Pd_3P$ in a sealed quartz ampoule. The resulting alloy was broken into pieces and loaded into an ion source having a tungsten needle and a tungsten heater ribbon. A stable mass spectrum was obtained, as illustrated in FIG. 5, including a significant amount of $P^{++}$ ions. The source operated in a stable fashion, and there was no apparent deterioration of the tungsten source elements.

As can now be appreciated, the present invention provides liquid metal ion sources for the simultaneous ion evaporation of arsenic and boron ions, and of arsenic, boron and phosphorus ions. The ability to evaporate combinations of different ions of practice interest in the semiconductor industry is highly significant, in that self-aligned ion implants can be accomplished with a high degree of accuracy, spatial resolution and reproducibility, because the ion beam source need not be changed in order to implant the various ionic species. That is, a source evaporating two or more elements simultaneously can be adjusted to implant a first evaporated species and then a second evaporated species without changing the operation of the source, and only by changing the settings of the mass separator. The alloys of the present invention allow the simultaneous ion beam evaporation and implantation of the ionic species of interest with a high degree of operating stability, and high beam fractions of each of the ionic species. Moreover, the sources have extended operating lifetimes, which are necessary for commercial operations. The source alloys can be ion evaporated from emitter needles and ribbons, or other source elements, made of conventional source materials such as tungsten and rhenium, without the need for the expensive specialized fabrication of exotic materials. Thus, the present invention provides an ion source meeting the requirements of commercial operations, which is capable of simultaneously ion evaporating arsenic and boron, or arsenic, boron and phosphorus.

Although a particular embodiment of the invention has been described in detail for purposes of illustration, various modifications may be made without departing from the spirit and scope of the invention. Accordingly, the invention is not to be limited except as by the appended claims.

What is claimed is:

1. A liquid metal ion source, comprising:
   emission means for emitting positively charged ionic species; and
   source means for supplying to said emission means the ionic species to be emitted, said species being provided in a substantially nickel-free alloy consisting essentially of palladium, arsenic, and at least one element to be co-emitted, said element being selected from the group consisting of boron, phosphorus, and combinations thereof.

2. The ion source of claim 1, wherein said alloy includes at least 50 atomic percent palladium.

3. The ion source of claim 1, wherein said alloy includes about 70 atomic percent palladium.

4. The ion source of claim 1, wherein said alloy contains palladium, arsenic and boron.

5. The ion source of claim 1, wherein said alloy is about 70 atomic percent palladium, 16 atomic percent arsenic, and 14 atomic percent boron.

6. The ion source of claim 1, wherein said alloy contains palladium, arsenic and phosphorus.

7. The ion source of claim 1, wherein said alloy contains palladium, arsenic, boron and phosphorus.

8. The ion source of claim 7, wherein said alloy is about 73 atomic percent palladium, 8 atomic percent arsenic, 7 atomic percent boron, and 12 atomic percent phosphorus.

9. The ion source of claim 1, wherein said emission means includes a needle emitter constructed of tungsten, and said source means includes a U-shaped heater element constructed of rhenium.

10. A liquid metal ion source for arsenic and boron ionic species, comprising:
    emission means for emitting positively charged ionic species; and
    source means for supplying to said emission means the ionic species to be emitted, said species being provided in a substantially nickel-free alloy consisting essentially of palladium, arsenic and boron, whereby arsenic and boron ions are simultaneously ion evaporated from said source.

11. A liquid metal ion source for arsenic, boron, and phosphorus ionic species, comprising:
    emission means for emitting positively charged ionic species; and.
    source means for supplying to said emission means the ionic species to be emitted, said species being provided in a substantially nickel-free alloy consisting essentially of palladium, arsenic, boron and phosphorus, whereby arsenic, boron and phosphorus are simultaneously ion evaporated from said source.

* * * * *

UNITED STATES PATENT AND TRADEMARK OFFICE
CERTIFICATE OF CORRECTION

PATENT NO. : 4,670,685
DATED : June 2, 1987
INVENTOR(S) : William M. Clark, Jr. et al It is certified that error appears in the above-identified patent and that said Letters Patent is hereby corrected as shown below:

Title page, Item (73), add as Assignee, -- Oregon Graduate Center For Study and Research, Beaverton, Oregon --.

Signed and Sealed this

Twenty-fifth Day of October, 1988

Attest:

DONALD J. QUIGG

Attesting Officer

Commissioner of Patents and Trademarks